(12) United States Patent
Ai

(10) Patent No.: US 12,272,636 B2
(45) Date of Patent: Apr. 8, 2025

(54) INTERCONNECTION STRUCTURE HAVING AIR GAP AND METHOD FOR MANUFACTURING THE SAME

(71) Applicant: NANYA TECHNOLOGY CORPORATION, New Taipei (TW)

(72) Inventor: Tsu-Chieh Ai, Taitung (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 18/581,826

(22) Filed: Feb. 20, 2024

(65) Prior Publication Data

US 2024/0194590 A1 Jun. 13, 2024

Related U.S. Application Data

(62) Division of application No. 17/491,716, filed on Oct. 1, 2021, now Pat. No. 12,100,650.

(51) Int. Cl.
| H01L 21/768 | (2006.01) |
| H01L 23/522 | (2006.01) |
| H01L 23/532 | (2006.01) |

(52) U.S. Cl.
CPC .... *H01L 23/5226* (2013.01); *H01L 21/76802* (2013.01); *H01L 21/7682* (2013.01); *H01L 21/76877* (2013.01); *H01L 23/5329* (2013.01)

(58) Field of Classification Search
CPC ........... H01L 21/76802; H01L 21/7682; H01L 21/76877; H01L 23/5226; H01L 23/5329
USPC ......................................................... 438/619
See application file for complete search history.

(56) References Cited

U.S. PATENT DOCUMENTS

| 11,894,265 B2* | 2/2024 | Clevenger ......... H01L 23/53266 |
| 2003/0168747 A1* | 9/2003 | Hussein ............... H01L 21/7682 257/762 |
| 2009/0166881 A1 | 7/2009 | Balakrishnan et al. |

OTHER PUBLICATIONS

Office Action and Search Report mailed on Apr. 11, 2024 related to U.S. Appl. No. 17/491,716, wherein this application is a Div of U.S. Appl. No. 17/491,716.

* cited by examiner

*Primary Examiner* — Hoai V Pham
(74) *Attorney, Agent, or Firm* — Xuan Zhang

(57) ABSTRACT

An interconnection structure and a method of manufacturing an interconnection structure are provided. The interconnection structure includes a first dielectric layer, a first conductive via in the first dielectric layer, and a first metal line disposed on the first dielectric layer and electrically connected with the first conductive via. At least a portion of the first metal line is exposed to a first air gap.

5 Claims, 26 Drawing Sheets

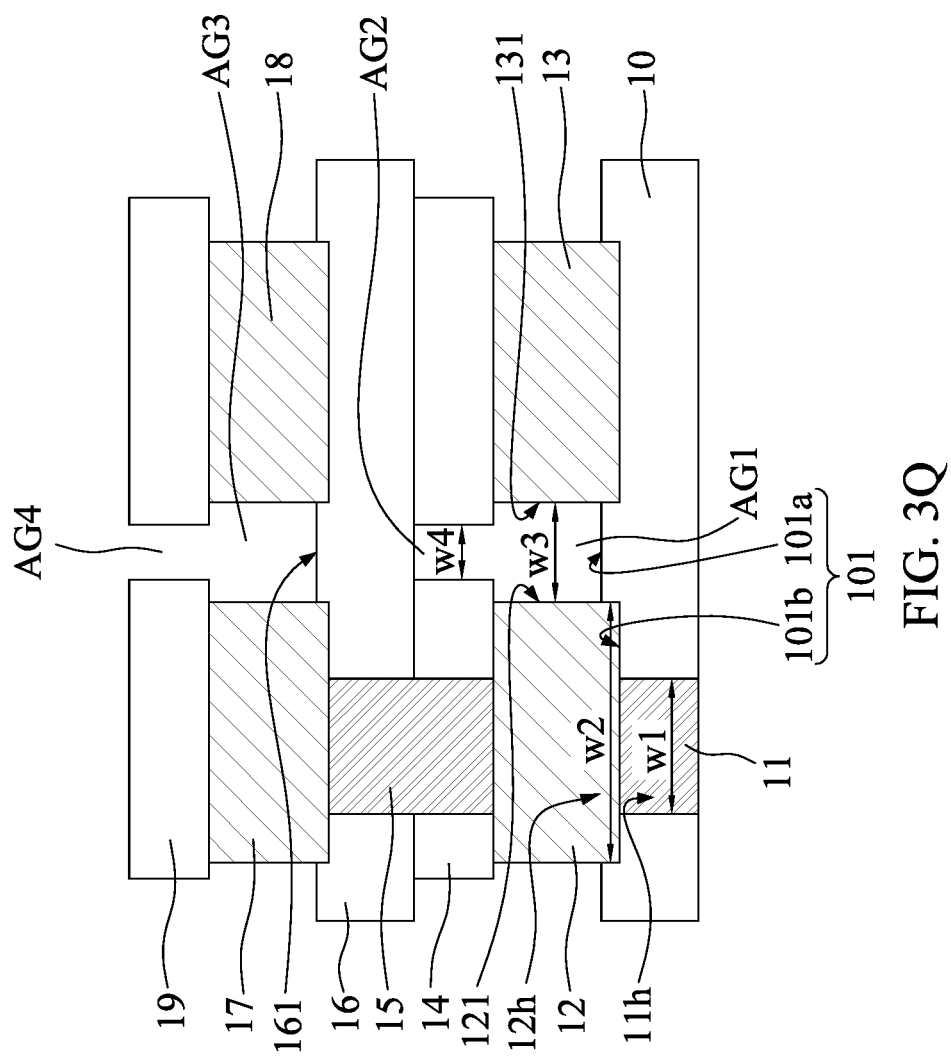

INTERCONNECTION STRUCTURE HAVING AIR GAP AND METHOD FOR MANUFACTURING THE SAME

CROSS-REFERENCE TO RELATED APPLICATION

This application is a divisional application of U.S. non-provisional application Ser. No. 17/491,716 filed Oct. 1, 2021, which is incorporated herein by reference in its entirety.

TECHNICAL FIELD

The present disclosure relates to an interconnection structure and a method for manufacturing the interconnection structure, and more particularly, to an interconnection structure having a gap and a method for manufacturing the interconnection structure having the gap.

DISCUSSION OF THE BACKGROUND

A variety of metallization layers comprising interconnection structures are formed over a substrate in back-end-of-line (BEOL) processes of a semiconductor device. The interconnection structures may include lateral interconnection structures such as metal lines and vertical interconnection structures such as conductive vias and/or plugs.

In order to prevent interference such as capacitive coupling between two adjacent metal lines from having an impact on the overall performance of the semiconductor device, low-K dielectric materials may be filled between adjacent metal lines. The low-K dielectric materials may be of a dielectric constant approximately equal to and less than 4.0. It is desired to further reduce capacitive coupling so as to improve the overall performance characteristics of the semiconductor device.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides an interconnection structure. The interconnection structure includes a first dielectric layer, a first conductive via in the first dielectric layer, and a first metal line disposed on the first dielectric layer and electrically connected with the first conductive via. At least a portion of the first metal line is exposed to a first air gap.

Another aspect of the present disclosure provides an interconnection structure. The interconnection structure includes a first dielectric layer and a second dielectric layer disposed over the first dielectric layer. The interconnection structure also includes a first conductive structure disposed between the first dielectric layer and the second dielectric layer and a second conductive structure disposed between the first dielectric layer and the second dielectric layer. The second conductive structure is isolated from the first conductive structure through a first air gap.

Another aspect of the present disclosure provides a method of manufacturing an interconnection structure. The method includes disposing a sacrificial layer on a first dielectric layer. The sacrificial layer has an etching property different from the first dielectric layer. The method also includes forming a trench in the first dielectric layer and the sacrificial layer. The method also includes forming a first metal line in the trench and removing the sacrificial layer from the first dielectric layer.

The air in the air gap exhibits a permittivity approximately equal to 1. Such a low permittivity helps to reduce the capacitive coupling between adjacent metal lines. Therefore, the overall performance characteristics of a semiconductor device including the interconnection structure may be improved.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 3Q illustrates one or more stages of a method of manufacturing an interconnection structure in accordance with some embodiments of the present disclosure.

DETAILED DESCRIPTION

Figure 1:
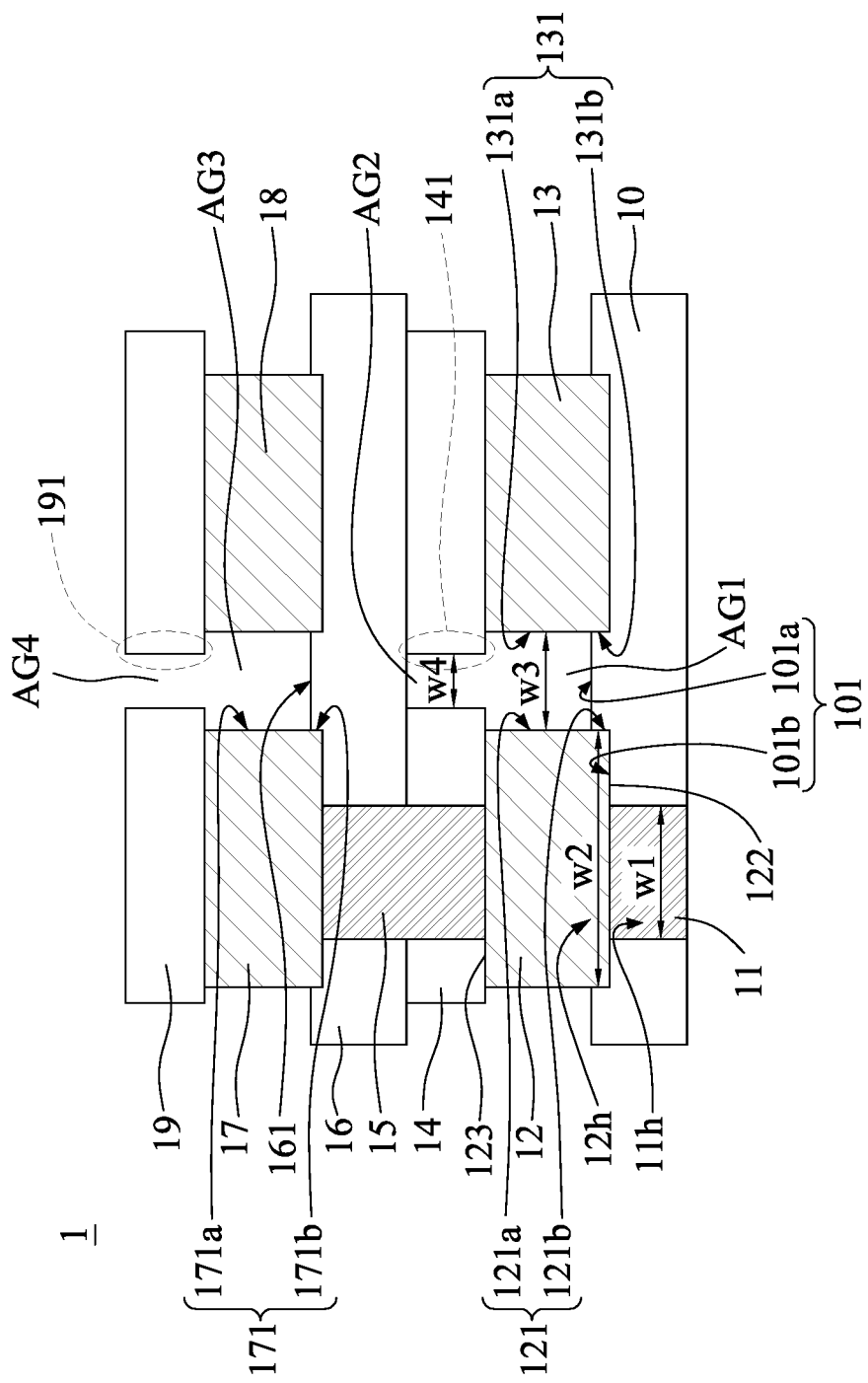
FIG. 1 illustrates a cross-sectional view of an interconnection structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 illustrates a cross-sectional view of an interconnection structure 1 in accordance with some embodiments of the present disclosure. The interconnection structure 1 may include dielectric layers 10, 14, 16, and 19, conductive vias 11 and 15, and metal lines 12, 13, 17, and 18.

In some embodiments, the interconnection structure 1 may be disposed over a substrate (not illustrated in the figures). In some embodiments, the interconnection structure 1 may be a part of one or more metallization layers over a substrate of a semiconductor device. While FIG. 1 illustrates two metallization layers (e.g., a metallization layer including the metal lines 12 and 13 and a metallization layer including the metal lines 17 and 18), it is contemplated that more inter-metal dielectric layers and the associated metal lines and conductive vias may be formed over the interconnection structure 1.

In some embodiments, the dielectric layer 14 may be disposed over and spaced apart from the dielectric layer 10. In some embodiments, the dielectric layer 16 may be disposed over and in contact with the dielectric layer 14. For example, the dielectric layer 16 may be directly in contact with the dielectric layer 14. In some embodiments, the dielectric layer 19 may be disposed over and spaced apart from the dielectric layer 16. The dielectric layers 10, 14, 16, and 19 may be stacked over one another along a stacking direction. In some embodiments, the stacking direction may be substantially perpendicular to a surface 101 (such as a top surface) of the dielectric layer 10 and/or a surface 106 of the dielectric layer 16.

In some embodiments, the dielectric layers 10, 14, 16, and 19 may each include a suitable dielectric material. For example, the dielectric layers 10, 14, 16, and 19 may each include silicon nitride ($Si_3N_4$), silicon oxynitride ($N_2OSi_2$), silicon nitride oxide ($N_2OSi_2$), tantalum pentoxide ($Ta_2O_5$), aluminum oxide ($Al_2O_3$), strontium bismuth tantalum oxide ($SrBi_2Ta_2O_9$, SBT), barium strontium titanate oxide (BaSrTiO₃, BST), or a combination thereof. In some embodiments, the dielectric layers 10, 14, 16, and 19 may each include a dielectric material having a dielectric constant that is higher than that of silicon dioxide ($SiO_2$), or a dielectric material having a dielectric constant of about 4.0 or greater. In some embodiments, the dielectric material of the dielectric layers 10, 14, 16, and 19 may be chosen based on one or more selective etching operations, which may be further described below with respect to FIG. 3I and FIG. 3P.

Figure 3A:
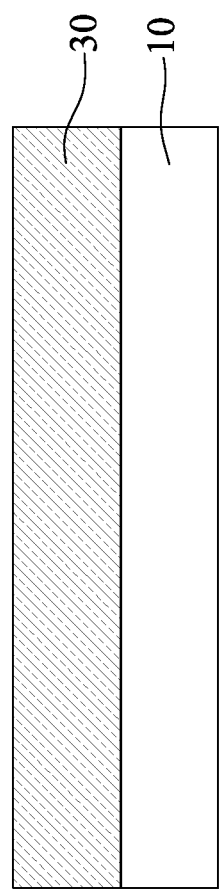
FIG. 3A illustrates one or more stages of a method of manufacturing an interconnection structure in accordance with some embodiments of the present disclosure.
Figure 3B:
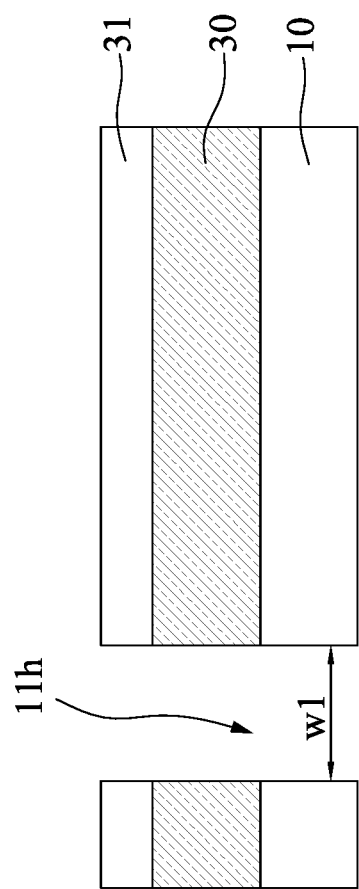
FIG. 3B illustrates one or more stages of a method of manufacturing an interconnection structure in accordance with some embodiments of the present disclosure.
Figure 3C:
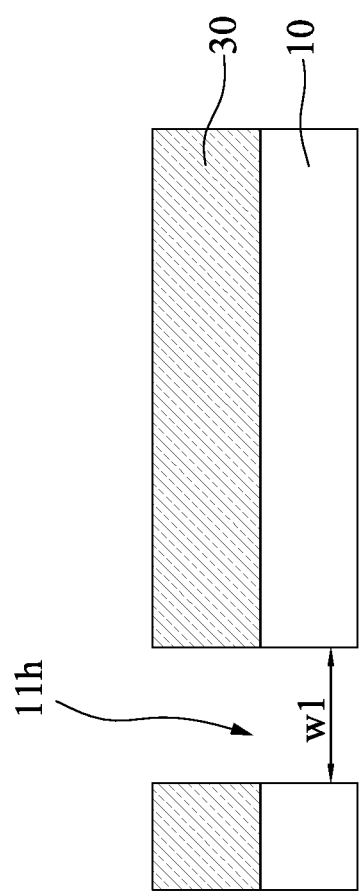
FIG. 3C illustrates one or more stages of a method of manufacturing an interconnection structure in accordance with some embodiments of the present disclosure.
Figure 3D:
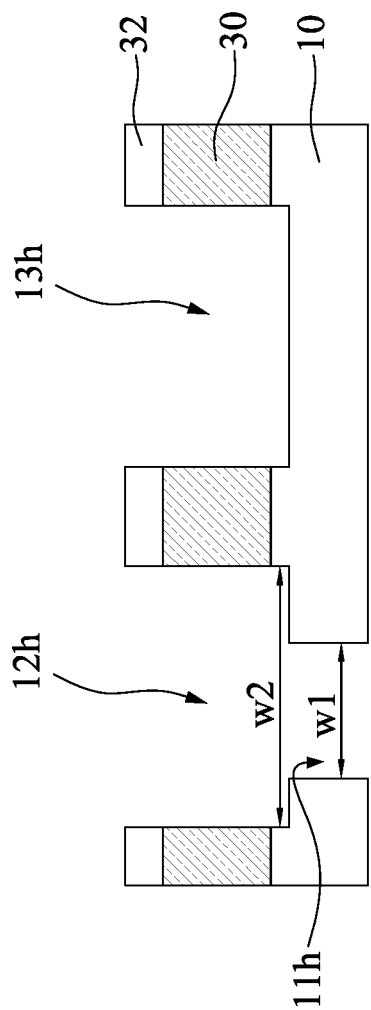
FIG. 3D illustrates one or more stages of a method of manufacturing an interconnection structure in accordance with some embodiments of the present disclosure.

In some embodiments, the dielectric layer 10 may define a via hole 11h and a trench 12h (also shown in FIG. 3D). The trench 12h may be located over the via hole 11h. For example, the trench 12h may be closer to the surface 101 of the dielectric layer 10 than the via hole 11h. In some embodiments, a dimension w2 (such as a width or a diameter) of the trench 12h may be greater than a dimension w1 (such as a width or a diameter) of the via hole 11h. The dimension w2 and the dimension w1 may be measured in a direction substantially parallel to the surface 101 of the dielectric layer 10. In other words, the dimension w2 and the dimension w1 may be measured in a direction substantially perpendicular to the stacking direction of the interconnection structure 1.

In some embodiments, the conductive via 11 may be disposed in the dielectric layer 10. For example, the conductive via 11 may be surrounded by the dielectric layer 10. For example, the conductive via 11 may be in contact with the dielectric layer 10. For example, the conductive via 11 may be disposed in the via hole 11h. In some embodiments, an end of the conductive via 11 may be non-coplanar with the surface 101 of the dielectric layer 10. For example, an end of the conductive via 11 may be located at an elevation between two opposite sides of the dielectric layer 10. In some embodiments, a part of the conductive via 11 may be exposed from the dielectric layer 10 to contact the metal line 12.

In some embodiments, the conductive via 15 may be disposed in the dielectric layers 14 and 16. For example, the conductive via 15 may be surrounded by the dielectric layers 14 and 16. For example, the conductive via 15 may be in contact with the dielectric layers 14 and 16. In some embodiments, an end of the conductive via 15 may be non-coplanar with the surface 161 of the dielectric layer 16. For example, an end of the conductive via 15 may be located at an elevation between two opposite sides of the dielectric layer 16. In some embodiments, a part of the conductive via 15 may be exposed from the dielectric layer 14 to contact the metal line 12.

In some embodiments, the conductive vias 11 and 15 may each include a suitable conductive material. For example, the conductive vias 11 and 15 may each include tungsten (W), copper (Cu), aluminum (Al), silver (Ag), an alloy thereof, or a combination thereof.

In some embodiments, the metal line 12 may be disposed on the dielectric layer 10. In some embodiments, the metal line 12 may be disposed between the dielectric layers 10 and 14 and electrically connected with the conductive vias 11 and 15. In some embodiments, the metal line 12 may be disposed on the conductive via 11. In some embodiments, the metal line 12 may be partially disposed in the trench 12h. For example, the metal line 12 may be partially surrounded by the dielectric layer 10. For example, the metal line 12 may partially penetrate the dielectric layer 10. For example, the metal line 12 may partially extend into the dielectric layer 10.

In some embodiments, the dimension w2 (such as a width or a diameter) of the metal line 12 may be greater than the dimension w1 (such as a width a diameter) of the conductive via 11.

In some embodiments, the metal line 13 may be disposed on the dielectric layer 10 and adjacent to the metal line 12. In some embodiments, the metal line 13 may be physically spaced apart from the metal line 12. In some embodiments, the metal line 13 may be disposed between the dielectric layers 10 and 14 and electrically connected with conductive vias (not illustrated in the figures) in the dielectric layers 10 and 14. In some embodiments, the metal line 13 may be partially surrounded by the dielectric layer 10. For example, the metal line 13 may partially penetrate the dielectric layer 10. For example, the metal line 13 may partially extend into the dielectric layer 10.

In some embodiments, the metal line 17 may be disposed on the dielectric layer 16. In some embodiments, the metal line 17 may be disposed between the dielectric layers 16 and 19 and electrically connected with the conductive via 15 and a conductive via (not illustrated in the figures) in the dielectric layer 19. In some embodiments, the metal line 17 may be partially surrounded by the dielectric layer 16. For example, the metal line 17 may partially penetrate the dielectric layer 16. For example, the metal line 17 may partially extend into the dielectric layer 16.

In some embodiments, the metal line 18 may be disposed on the dielectric layer 16 and adjacent to the metal line 17. In some embodiments, the metal line 18 may be disposed between the dielectric layers 16 and 19 and electrically connected with conductive vias (not illustrated in the figures) in the dielectric layers 16 and 19. In some embodiments, the metal line 18 may be partially surrounded by the dielectric layer 16. For example, the metal line 18 may partially penetrate the dielectric layer 16. For example, the metal line 18 may partially extend into the dielectric layer 16.

In some embodiments, the metal lines 12, 13, 17, and 18 may each include a suitable conductive material. For example, the metal lines 12, 13, 17, and 18 may each include tungsten (W), copper (Cu), aluminum (Al), silver (Ag), an alloy thereof, or a combination thereof.

In some embodiments, an interface between one of the metal lines 12, 13, 17, and 18 and one of the conductive vias 11 and 15 may be observed. In some embodiments, one of the metal lines 12, 13, 17, and 18 may be formed of a material different from one of the conductive vias 11 and 15. For example, the metal line 12 may be formed of a material different from the conductive via 11, and an interface between the metal line 12 and the conductive via 11 may be observed.

However, in some other embodiments, interface between the metal line 12 and the conductive via 11 may not be observed. In some other embodiments, the metal line 12 and the conductive via 11 may be formed of the same material. The metal line 12 and the conductive via 11 may be alternatively referred to as an upper portion (which has a greater dimension w2) and a lower portion (which has a smaller dimension w1), respectively, of a conductive structure.

Similarly, interface between the metal line 17 and the conductive via 15 may not be observed. The metal line 17 and the conductive via 15 may be alternatively referred to as an upper portion (which has a greater dimension) and a lower portion (which has a smaller dimension), respectively, of a conductive structure.

In some embodiments, a barrier layer (not illustrated in the figures) may surround one or more of the conductive vias 11 and 15, and the metal lines 12, 13, 17, and 18. The barrier layer may prevent the conductive material from diffusing into the adjacent dielectric layers (such as the dielectric layers 10, 14, and 16). In some embodiments, the barrier layer may include a suitable conductive material such as titanium (Ti), titanium nitride (TiN), manganese (Mn), an alloy thereof, or a combination thereof.

Furthermore, a seed layer (not illustrated in the figures) may be formed over the barrier layer in accordance with various embodiments. The seed layer may include a suitable conductive material such as copper (Cu), nickel (Ni), gold (Au), an alloy thereof, or a combination thereof. In addition, the seed layer may be alloyed with a material that improves the adhesive properties of the seed layer so that it can act as an adhesion layer. For example, the seed layer may be alloyed with a suitable material such as manganese (Mn), aluminum (Al), or the like, which will migrate to the interface between the seed layer and the barrier layer and will enhance the adhesion between these two layers.

In some embodiments, a part of the metal line 12 may be exposed to an air gap AG1. For example, a part of the metal line 12 may be exposed to air through the air gap AG1. For example, the metal line 12 may have a surface 123 in contact with the conductive via 15 and the dielectric layer 14 and a surface 122 in contact with the conductive via 11 and the dielectric layer 10. A surface 121 of the metal line 12 between the dielectric layer 10 and the dielectric layer 14 may be exposed to the air gap AG1. For example, the metal line 12 may include opposite sides contacting the conductive vias 11 and 15 and the surface 121 of the metal line 12 may extend between the opposite sides.

For example, the surface 121 of the metal line 12 may have a portion 121*a* and a portion 121*b* connected with the portion 121*a*. The portion 121*a* may be exposed from the dielectric layer 10. The portion 121*a* may be exposed to the air gap AG1. The portion 121*b* may be surrounded or covered by the dielectric layer 10. For example, the air gap AG1 may be adjacent to the surface 121 of the metal line 12. For example, a lower portion of the surface 121 of the metal line 12 may be surrounded or covered by the dielectric layer 10 and an upper portion of the surface 121 of the metal line 12 may be exposed from the dielectric layer 10.

Similarly, in some embodiments, a part of the metal line 13 may be exposed to the air gap AG3. For example, a part of the metal line 13 may be exposed to air through the air gap AG3. For example, a surface 131 of the metal line 13 between the dielectric layer 16 and the dielectric layer 19 may be exposed to the air gap AG3.

For example, the surface 131 of the metal line 13 may have a portion 131*a* and a portion 131*b* connected with the portion 131*a*. The portion 131*a* may be exposed from the dielectric layer 10. The portion 131*a* may be exposed to the air gap AG1. The portion 131*b* may be surrounded or covered by the dielectric layer 10. For example, the air gap AG3 may be adjacent to the surface 131 of the metal line 13. For example, a lower portion of the surface 131 of the metal line 13 may be surrounded or covered by the dielectric layer 16 and an upper portion of the surface 131 of the metal line 13 may be exposed from the dielectric layer 16.

In some embodiments, the air gap AG1 may be defined between the metal lines 12 and 13. For example, the air gap AG1 may be defined between the surface 121 of the metal line 12 and the surface 131 of the metal line 13.

In some embodiments, the metal line 12 may be isolated from the metal line 13 through the air gap AG1. For example, the metal line 12 may be spaced apart from the metal line 13 through the air gap AG1. In some embodiments, the surface 101 of the dielectric layer 10 may also be exposed to the air gap AG1. For example, the surface 101 of the dielectric layer 10 may have a portion 101*a* and a portion 101*b* connected with the portion 101*a*. The portion 101*a* may be exposed from the metal line 12. The portion 101*a* may be exposed to the air gap AG1. The portion 101*b* may be covered by the metal line 12.

In some embodiments, the dielectric layer 14 may define an air gap AG2 over the air gap AG1. For example, the air gap AG2 may be formed in the dielectric layer 14. For example, the air gap AG2 may penetrate through the dielectric layer 14. In some embodiments, air may conduct between the air gap AG2 and the air gap AG1.

In some embodiments, a dimension w3 (such as the shortest distance between the surface 121 of the metal line 12 and the surface 131 of the metal line 13) of the air gap AG1 may be greater than a dimension w4 (such as a width or a diameter) of the air gap AG2 defined by the dielectric layer 14. In other words, the dimension w4 may be less than the dimension w3. For example, the air gap AG2 may be smaller than the air gap AG1. For example, the dielectric layer 14 may include an overhang portion 141 over the air gap AG1. The overhang portion 141 may protrude or stick out from the surface 121 of the metal line 12 and the surface 131 of the metal line 13 to be located over the air gap AG1. In some embodiments, the dimension w3 and the dimension w4 may be measured in a direction substantially parallel to the surface 101 of the dielectric layer 10. In other words, the dimension w3 and the dimension w4 may be measured in a direction substantially perpendicular to the stacking direction of the interconnection structure 1.

In some embodiments, the top (or an end) of the air gap AG2 may be covered by the dielectric layer 16. In some embodiments, the air gap AG3 may be physically separated from the air gap AG1 and the air gap AG2 through the dielectric layer 16. In some embodiments, the air gap AG1 and the air gap AG2 may be collectively referred to as an empty space defined between the metal lines 12 and 13 and between the dielectric layers 10 and 16. In some embodiments, the empty space may be filled with air. In some embodiments, the empty space may be vacuumed. In some embodiments, the metal line 12 may be isolated from the metal line 13 through the empty space.

In some embodiments, the dielectric layer 14 may be used to build up another metallization layer (which includes the metal lines 17 and 18) over the metal lines 12 and 13. The air gap AG2 defined by the dielectric layer 14 may help with removing the dielectric layer between the metal lines 12 and 13 (such as the operation illustrated in FIG. 3I) to form the air gap AG1. The dielectric layer 16 may be used to prevent conductive materials of the metal lines 17 and 18 from filling into the air gap AG1.

Similarly, an air gap AG3 may be defined between the metal lines 17 and 18. The dielectric layer 19 may define an air gap AG4 over the air gap AG3. The air gap AG4 may be smaller than the air gap AG3. For example, the dielectric layer 19 may include an overhang portion 191 over the air gap AG3. The overhang portion 191 may protrude or stick out from a surface of the metal line 17 and a surface of the metal line 18 to be located over the air gap AG3. For example, a surface 171 of the metal line 17 may have a portion 171*a* and a portion 171*b* connected with the portion 171*a*. The portion 171*a* may be exposed from the dielectric layer 16. The portion 171*a* may be exposed to the air gap AG3. The portion 171*b* may be surrounded or covered by the dielectric layer 16.

If more inter-metal dielectric layers and the associated metal lines and conductive vias are to be formed over the interconnection structure 1, another dielectric layer may be disposed on the dielectric layer 19 and cover the air gap AG4. It should be noted that while FIG. 1 illustrates four air gaps (e.g., the air gaps AG1, AG2, AG3, and AG4) being formed in the interconnection structure 1, the interconnection structure 1 could accommodate any number of air gaps. The four air gaps are illustrated for simplicity.

In some embodiments, an anti-oxidation layer may be disposed in a boundary of the metal lines 12, 13, 17, and 18 with the air gaps (such as the air gaps AG1 and AG3) to protect the metal lines 12, 13, 17, and 18 from oxidation.

According to some embodiments of the present disclosure, by isolating the adjacent metal lines 12 and 13 through the air gap AG1, parasitic capacitance between the metal lines 12 and 13 may be lowered by about 2.5 times or more in comparison with filling low-K dielectric materials between the metal lines 12 and 13. For example, the air in the air gap AG1 exhibits a permittivity approximately equal to 1. Such a low permittivity helps to reduce the capacitive coupling between adjacent metal lines 12 and 13. Therefore, the overall performance characteristics of a semiconductor device including the interconnection structure 1 may be improved.

FIGS. 2A, 2B, 2C, 2D, 2E, 2F, and 2G each illustrates a top view of a part of an interconnection structure in accordance with some embodiments of the present disclosure. In some embodiments, the top view of each of FIGS. 2A, 2B, 2C, 2D, 2E, 2F, and 2G may be a top view of an interconnection structure similar to the interconnection structure 1 of FIG. 1. In some embodiments, some elements in FIG. 1 have been simplified or not shown in FIGS. 2A, 2B, 2C, 2D, 2E, 2F, and 2G for a better understanding of the aspects of the present disclosure.

Figure 2A:
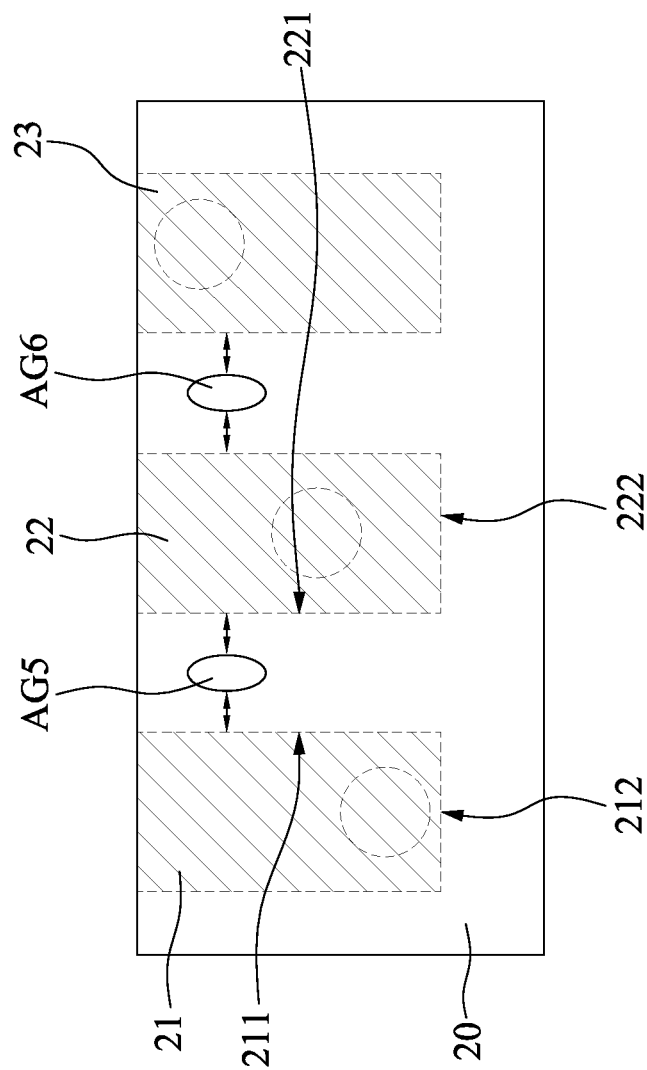
FIG. 2A illustrates a top view of a part of an interconnection structure in accordance with some embodiments of the present disclosure.

The dielectric layer 20 may be similar to the dielectric layer 14 in FIG. 1. The metal lines 21, 22, and 23 may be similar to the metal lines 12 and 13 in FIG. 1. As shown in FIG. 2A, the air gaps AG5 and AG6 defined by the dielectric layer 20 may be spaced apart from the metal lines 21, 22, and 23 to prevent the metal lines 21, 22, and 23 from being undermined or damaged. For example, the projection area of the air gaps AG5 and AG6 may not be overlapped with the projection area of the metal lines 21, 22, and 23 on the dielectric layer 20.

Referring to FIG. 2A, a surface 211 of the metal line 21 and a surface 221 of the metal line 22 may be exposed to an air gap (such as the air gap AG1 in FIG. 1) below the air gap AG5. The air gap AG5 is smaller than the underlying air gap, and is located between the surface 211 of the metal line 21 and the surface 221 of the metal line 22. In some embodiments, the air gap AG5 may be substantially located in the middle of the gap or spacing between the surface 211 of the metal line 21 and the surface 221 of the metal line 22. For example, the distance (such as the shortest distance) between the air gap AG5 and the surface 211 of the metal line 21 may be substantially equal to the distance (such as the shortest distance) between the air gap AG5 and the surface 221 of the metal line 22. Similarly, the air gap AG6 may be substantially located in the middle of the gap or spacing between the metal line 22 and the metal line 23.

Figure 2B:
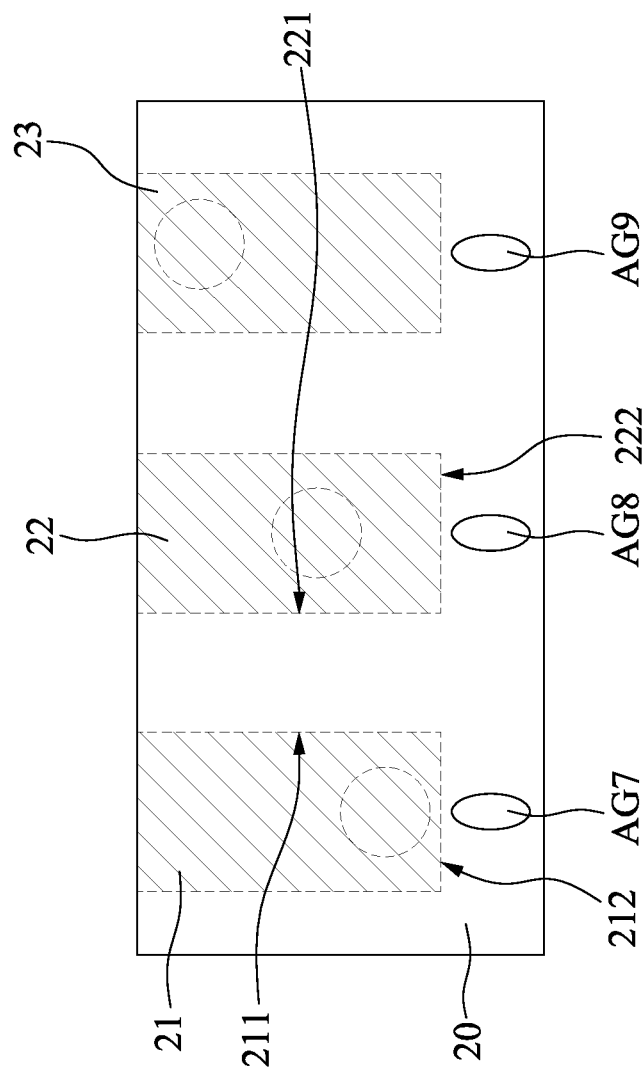
FIG. 2B illustrates a top view of a part of an interconnection structure in accordance with some embodiments of the present disclosure.

Referring to FIG. 2B, in some embodiments, the metal line 21 may have a short side 212 shorter than the surface 211 (which may also be referred to as a long side of the metal line 21). In some embodiments, the air gap AG7 may be disposed adjacent to the short side 212 of the metal line 21. The short side 212 of the metal line 21 may be exposed to an air gap (not illustrated in the figures) below the air gap AG7. The air gap AG7 is smaller than the underlying air gap. Similarly, the air gap AG8 may be disposed adjacent to the short side 222 of the metal line 22 and the air gap AG9 may be disposed adjacent to the short side of the metal line 23.

Figure 2C:
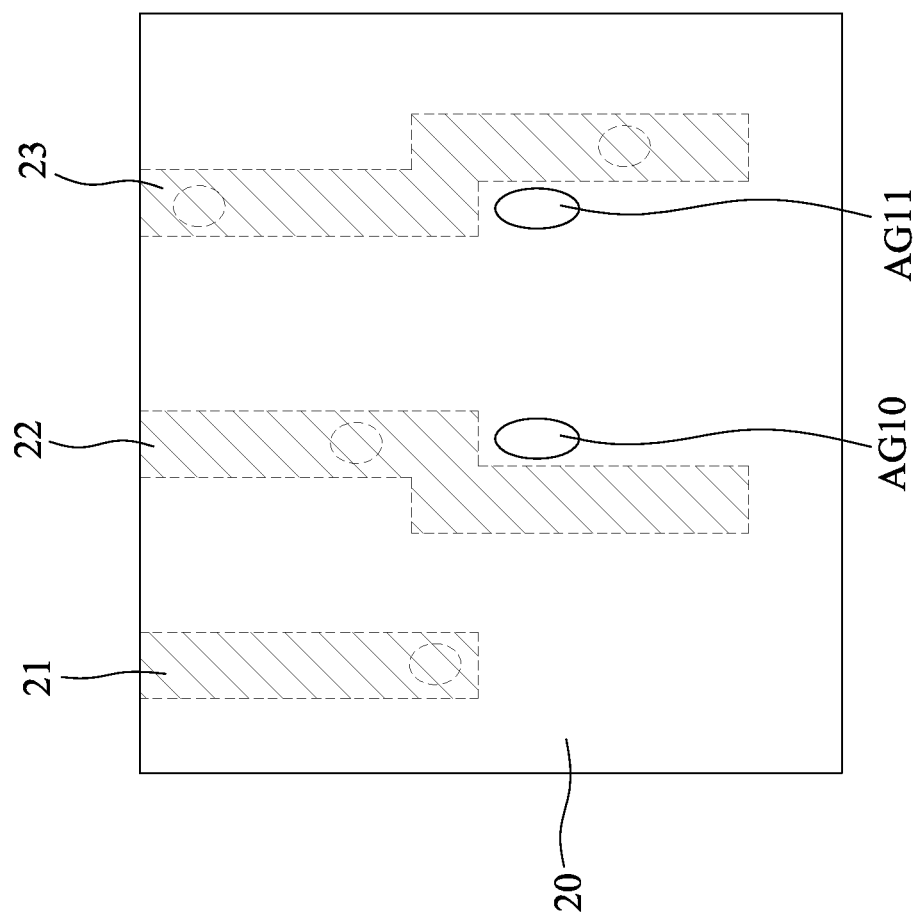
FIG. 2C illustrates a top view of a part of an interconnection structure in accordance with some embodiments of the present disclosure.

Referring to FIG. 2C, in some embodiments, the metal lines 22 and 23 may have corners or turning points.

In some embodiments, the air gap AG10 may be adjacent to a corner of the metal line 22 and the air gap AG11 may be adjacent to a corner of the metal line 23. For example, the air gap AG10 may be partially surrounded by the metal line 22 and the air gap AG11 may be partially surrounded by the metal line 23 from a top view.

Figure 2D:
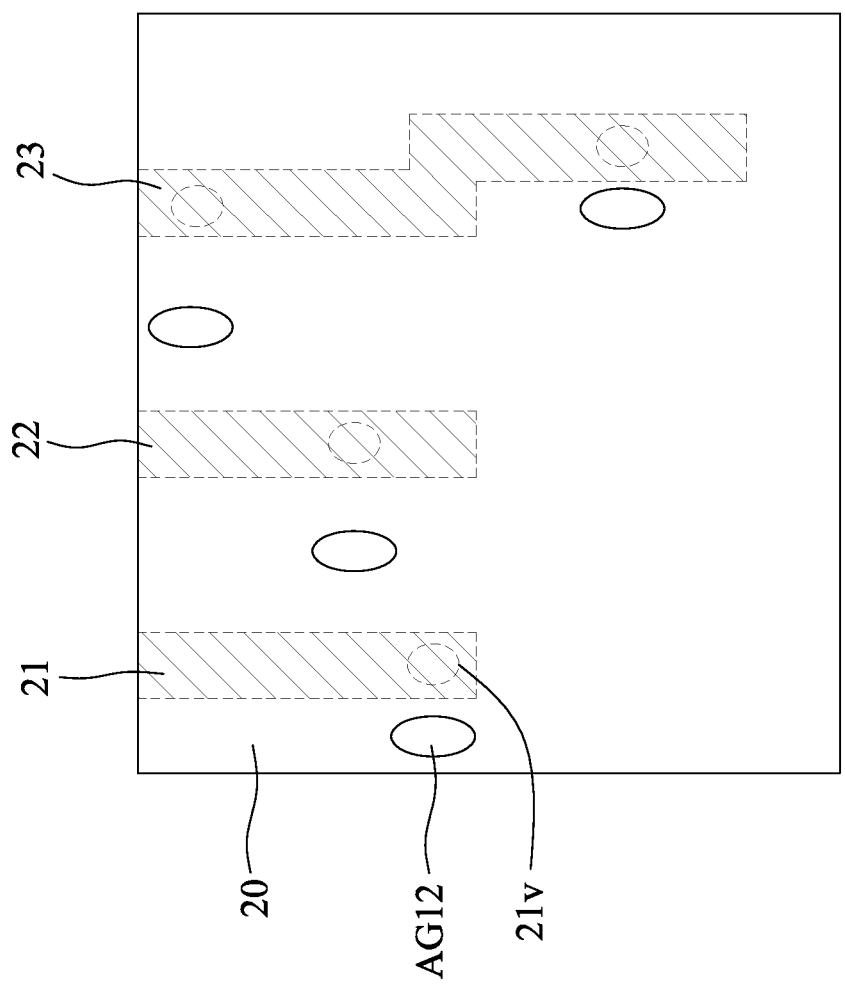
FIG. 2D illustrates a top view of a part of an interconnection structure in accordance with some embodiments of the present disclosure.

Referring to FIG. 2D, in some embodiments, the air gap AG12 may be adjacent to a conductive via 21v electrically connected with the metal line 21. The conductive via 21v may be similar to the conductive vias 11 and 15 in FIG. 1.

Figure 2E:
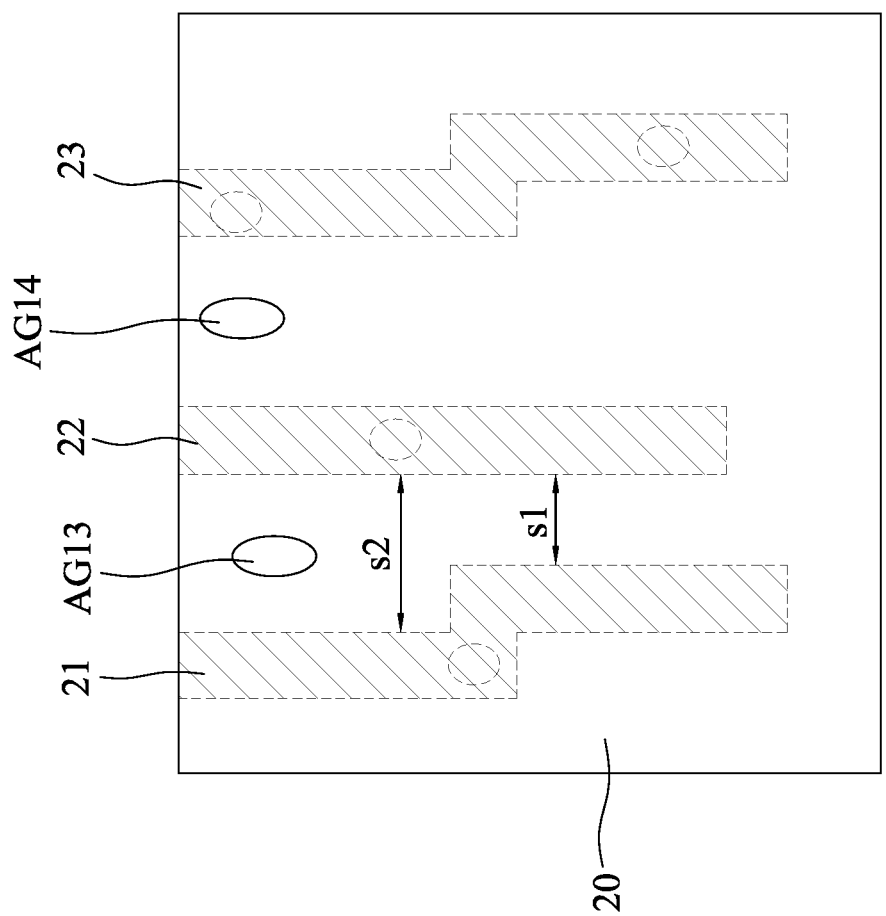
FIG. 2E illustrates a top view of a part of an interconnection structure in accordance with some embodiments of the present disclosure.
Figure 2F:
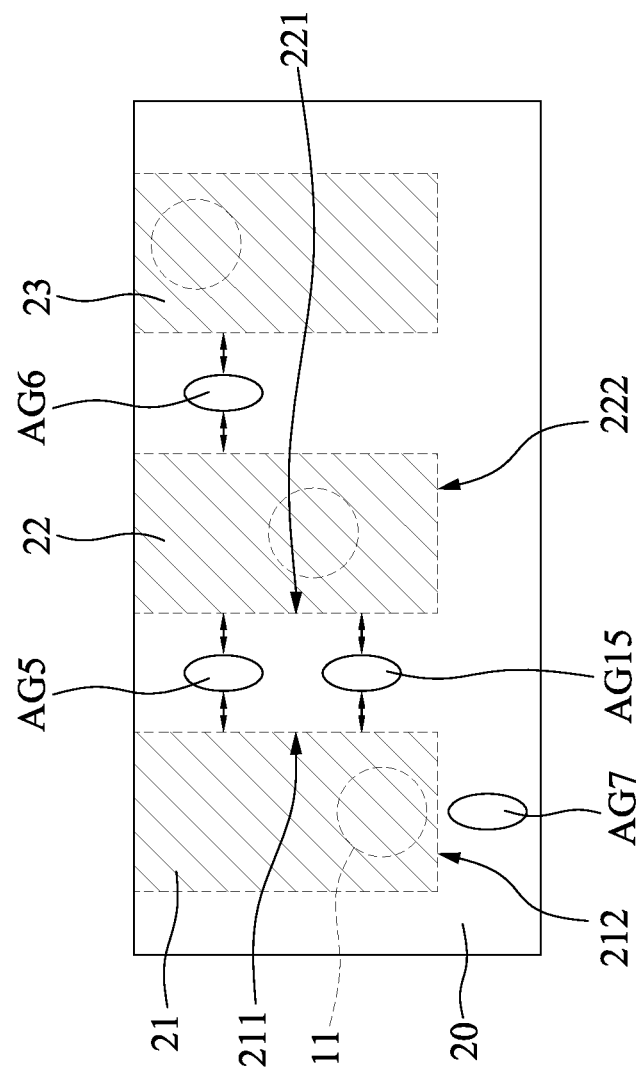
FIG. 2F illustrates a top view of a part of an interconnection structure in accordance with some embodiments of the present disclosure.

Referring to FIG. 2E, in some embodiments, the spacing between the metal line 21 and the metal line 22 may not be constant. For example, the shortest distance s1 between the metal line 21 and the metal line 22 may be about 112 nanometers (nm). The longest distance s2 between the metal line 21 and the metal line 22 may be greater than 112 nm. The air gap AG13 may be located in a gap between the metal line 21 and the metal line 22 with a longer or greater spacing or distance (such as the longest distance s2). The air gap AG14 may be located in a gap between the metal line 22 and the metal line 23 as long as the gap has a spacing or distance longer or greater than about 112 nm. In some embodiments, the spacing or distance of the gap may be adjusted based on the designed requirements, such as the pitch and spacing of the metal lines.

The air gapsof different locations, dimensions, sizes, and shapes described above may be combined or exist in an interconnection structure similar to the interconnection structure 1 of FIG. 1 according to some embodiments of the present disclosure. For example, referring to FIG. 2F, in some embodiments, the air gap AG7 (also shown in FIG. 2B) may be disposed adjacent to the short side 212 of the metal line 21 while the air gap AG5 (also shown in FIG. 2A) may be disposed adjacent to the long side 211 of the metal line 21. Therefore, the short side 212 and the long side 211 of the metal line 21 may be exposed to an air gap (such as the air gap AG1 in FIG. 1) below the air gap AG7 and air gap (such as the air gap AG1 in FIG. 1) below the air gap AG5, respectively.

Figure 2G:
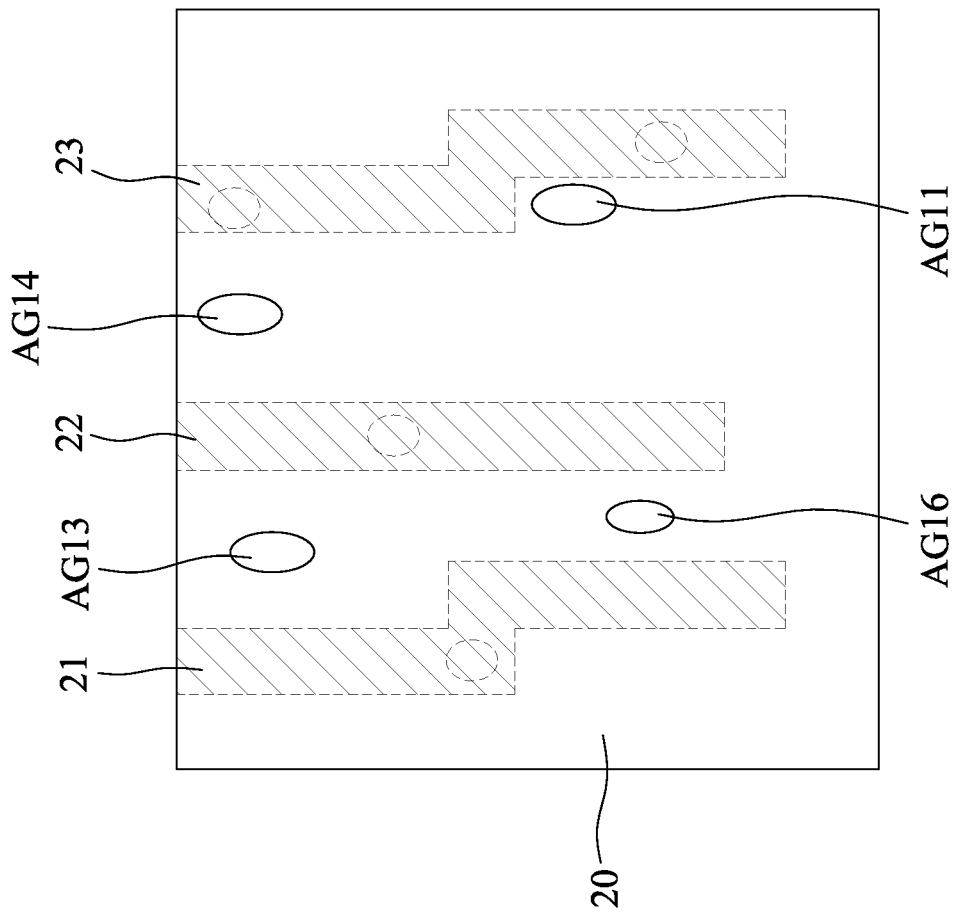
FIG. 2G illustrates a top view of a part of an interconnection structure in accordance with some embodiments of the present disclosure.

Furthermore, in some embodiments, the air gap AG15 and the air gap AG5 may be aligned. For example, the spacing between the surface 211 of the metal line 21 and the surface 221 of the metal line 22 may be constant, and the air gap AG15 and the air gap AG5 may be aligned, such as arranged in a straight line. Referring to FIG. 2G, in some embodiments, the air gap AG16 may be located in a gap between the metal line 21 and the metal line 22 with a shorter or less spacing or distance, and the air gap AG13 (also shown in FIG. 2E) may be located in a gap between the metal line 21 and the metal line 22 with a longer or greater spacing or distance.

In order to prevent the metal lines 21 and 22 from being undermined or damaged, the air gap AG16 may be smaller than the air gap AG13. For example, the projection area of the air gap AG16 may be smaller than the projection area of the air gap AG13 on the dielectric layer 20. However, in some other embodiments, the size of the air gaps may be substantially identical for better processing control.

Furthermore, in some embodiments, the air gap AG14 (also shown in FIG. 2E) may be closer to the metal line 23 than to the metal line 22. In some embodiments, the air gap AG11 (also shown in FIG. 2C) may be adjacent to a corner of the metal line 23 while the other air gaps may not be adjacent to the corners.

The locations, dimensions, sizes, and shapes of the air gaps according to some embodiments of the present disclosure may be adjusted based on design requirements and are not limited to the specific embodiments illustrated in the figures.

FIGS. 3A, 3B, 3C, 3D, 3E, 3F, 3G, 3H, 3I, 3J, 3K, 3L, 3M, 3N, 3O, 3P, and 3Q illustrate stages of a method of manufacturing an interconnection structure in accordance with some embodiments of the present disclosure. At least some of these figures have been simplified for a better understanding of the aspects of the present disclosure. In some embodiments, the interconnection structure 1 in FIG. 1 may be manufactured by the operations described below with respect to FIGS. 3A, 3B, 3C, 3D, 3E, 3F, 3G, 3H, 3I, 3J, 3K, 3L, 3M, 3N, 3O, 3P, and 3Q.

Referring to FIG. 3A, the dielectric layer 10 may be disposed on a substrate (not illustrated in the figures). A sacrificial layer 30 may be disposed on the dielectric layer 10. The sacrificial layer 30 may have or exhibit an etching property different from the dielectric layer 10. For example, the etch rate of the sacrificial layer 30 may be greater than the etch rate of the dielectric layer 10 in the selective etching operation in FIG. 3I. In some embodiments, the sacrificial layer 30 may include a low-K dielectric material, such as silicon dioxide ($SiO_2$), fluorosilicate glass (FSG), flowable oxide (FOx), etc. In some embodiments, the sacrificial layer 30 may be formed using a suitable deposition process such as chemical vapor deposition (CVD).

Referring to FIG. 3B, a photoresist layer 31 and a hard mask (not illustrated in the figures) may be formed over the sacrificial layer 30. The photoresist layer 31 may be patterned according to the location and the shape of a conductive via to be formed in the sacrificial layer 30 and the dielectric layer 10 (such as the conductive via 11 shown in FIG. 1). More particularly, the photoresist layer 31 may be exposed and developed as part of a suitable photolithography process. After the photolithography process finishes, a via hole 11*h* with the dimension w1 may be formed in the sacrificial layer 30 and the dielectric layer 10 as shown in FIG. 3B.

Referring to FIG. 3C, the remaining photoresist layer 31 as shown in FIG. 3B may be removed by using suitable photoresist stripping techniques such as chemical solvent cleaning, plasma ashing, dry stripping, etc.

Referring to FIG. 3D, a photoresist layer 32 and a hard mask (not illustrated in the figures) may be formed over the sacrificial layer 30. The photoresist layer 32 may be patterned according to the location and the shape of the metal line to be formed in the sacrificial layer 30 and the dielectric layer 10 (such as the metal lines 12 and 13 shown in FIG. 1). More particularly, the photoresist layer 32 may be exposed and developed as part of a suitable photolithography process. After the photolithography process finishes, a trench 12*h* with the dimension w2 and a trench 13*h* may be formed in the sacrificial layer 30 and the dielectric layer 10 as shown in FIG. 3D. The trench 12*h* may be over the via hole 11*h*. The dimension w2 of the trench 12*h* may be greater than the dimension w1 of the via hole 11*h*. In some embodiments, the trench 12*h* may be formed by etching away a part of the sacrificial layer 30 and a part of the dielectric layer 10.

Figure 3E:
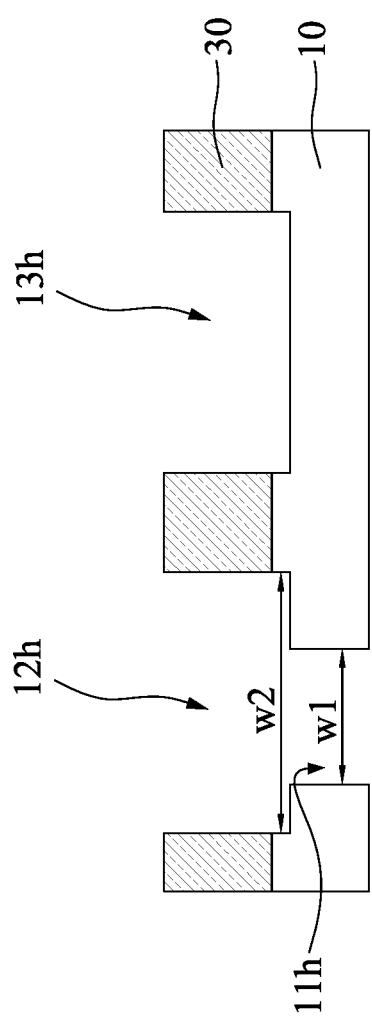
FIG. 3E illustrates one or more stages of a method of manufacturing an interconnection structure in accordance with some embodiments of the present disclosure.

Referring to FIG. 3E, the remaining photoresist layer 32 as shown in FIG. 3D may be removed by using suitable photoresist stripping techniques such as chemical solvent cleaning, plasma ashing, dry stripping, etc.

Figure 3F:
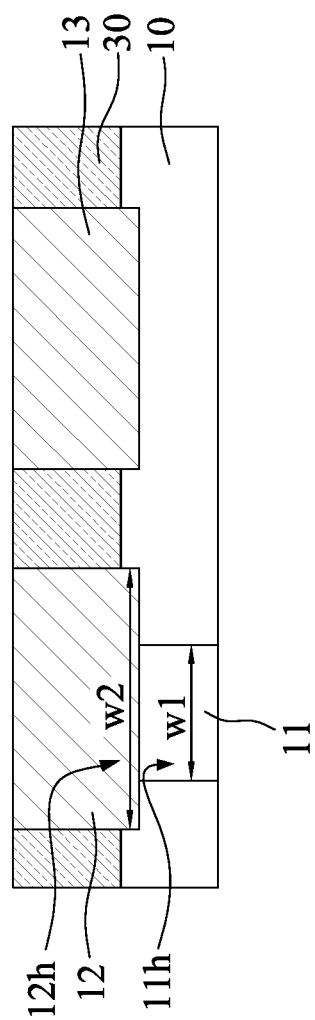
FIG. 3F illustrates one or more stages of a method of manufacturing an interconnection structure in accordance with some embodiments of the present disclosure.

Referring to FIG. 3F, a conductive material of the conductive via 11 may be formed in the via hole 11*h* shown in FIG. 3D and a conductive material of the metal lines 12 and 13 may be formed in the trenches 12*h* and 13*h* shown in FIG. 3D. The conductive material may be formed by suitable techniques such as electroplating, an electro-less plating process, CVD, physical vapor deposition (PVD), etc. In some embodiments, the metal line 12 and the conductive via 11 may be formed of the same material. In such embodiments, interface between the metal line 12 and the conductive via 11 may not be observed. In some embodiments, the conductive via 11, the metal line 12 and the metal line 13 may be formed by dual damascene techniques. In some embodiments, the conductive via 11, the metal line 12 and the metal line 13 may be formed in the same operation.

In some embodiments, a barrier layer and/or a seed layer (not illustrated in the figures) may be disposed in the via hole 11*h* and the trenches 12*h* and 13*h*. Therefore, a barrier layer and/or a seed layer may be formed around the conductive via 11, the metal line 12 and/or the metal line 13.

In some embodiments, a planarization process may be performed to remove excess conductive materials. The planarization process may be implemented by using suitable techniques such as grinding, polishing, chemical etching, etc.

Figure 3G:
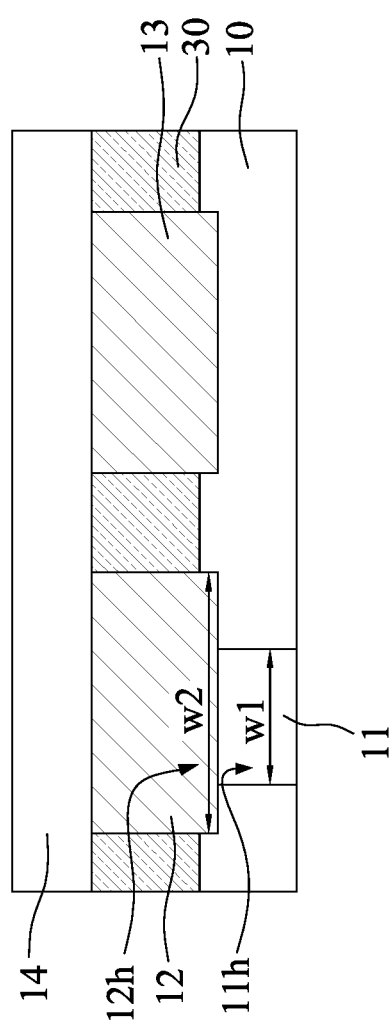
FIG. 3G illustrates one or more stages of a method of manufacturing an interconnection structure in accordance with some embodiments of the present disclosure.

Referring to FIG. 3G, the dielectric layer 14 may be disposed on the sacrificial layer 30 and the metal lines 12 and 13. The dielectric layer 14 may have or exhibit an etching property different from the sacrificial layer 30. For example, the etch rate of the sacrificial layer 30 may be greater than the etch rate of the dielectric layer 14 in the selective etching operation in FIG. 3I. In some embodiments, the dielectric layer 14 may be formed using a suitable deposition process such as CVD.

Figure 3H:
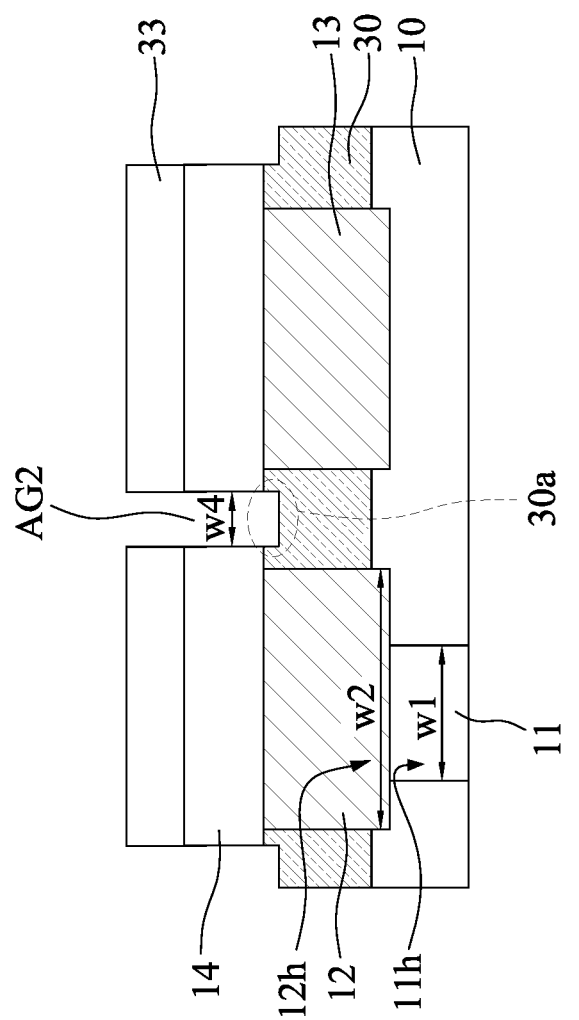
FIG. 3H illustrates one or more stages of a method of manufacturing an interconnection structure in accordance with some embodiments of the present disclosure.

Referring to FIG. 3H, a photoresist layer 33 and a hard mask (not illustrated in the figures) may be formed over the dielectric layer 14. The photoresist layer 33 may be patterned, exposed, and developed as part of a suitable photolithography process. After the photolithography process finishes, an air gap AG2 with the dimension w4 may be formed in the dielectric layer 14 as shown in FIG. 3H. The air gap AG2 defined by the dielectric layer 14 may be spaced apart from the metal lines 12 and 13 to prevent the metal lines 12 and 13 from being undermined or damaged.

In some embodiments, a portion of the sacrificial layer 30 may be exposed from the air gap AG2. In some embodiments, a portion 30*a* of the sacrificial layer 30 may be removed through the air gap AG2.

In some embodiments, the air gap AG2 may help with removing the sacrificial layer 30 in the subsequent operation. It should be noted that the shape of the air gap AG2 shown in FIG. 3H is selected purely for demonstration purposes and is not intended to limit the various embodiments of the present disclosure. For example, it is within the scope and spirit of the present disclosure for the air gap AG2 to include other shapes, such as, but no limited to, a trapezoidal shape, oval, square, triangle, etc.

Figure 3I:
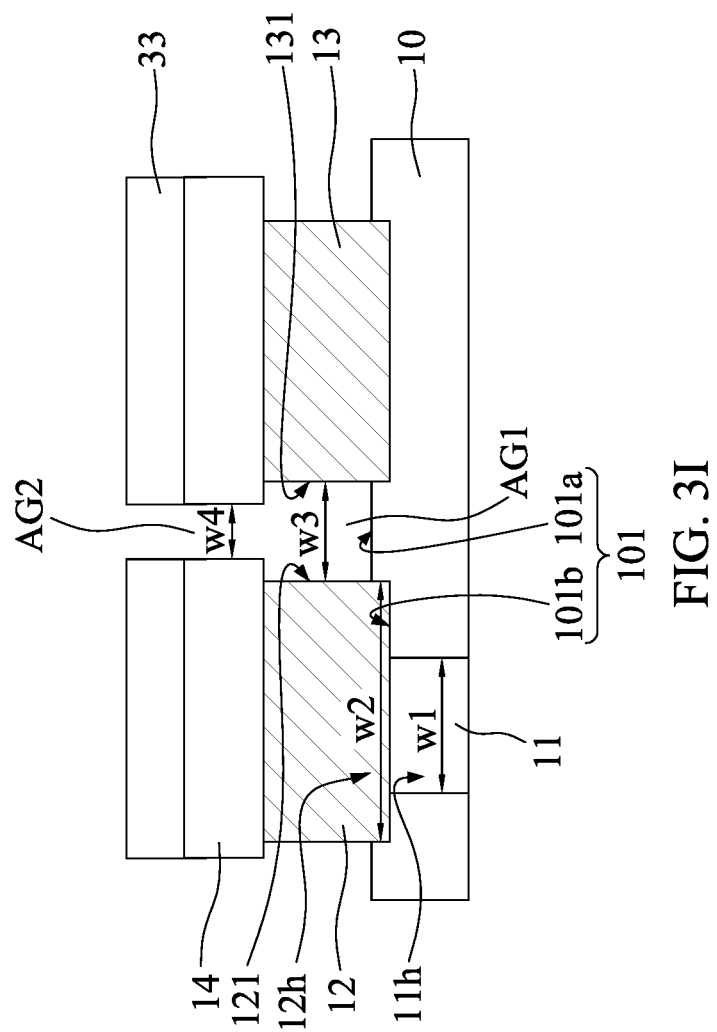
FIG. 3I illustrates one or more stages of a method of manufacturing an interconnection structure in accordance with some embodiments of the present disclosure.

Referring to FIG. 3I, a selective etching may be performed to remove the sacrificial layer 30. The etch rate of the sacrificial layer 30 may be greater than the etch rate of the dielectric layer 10 so the substrate (not illustrated in the figures) below the dielectric layer 10 can be protected from the erosion.

After removing the sacrificial layer 30, the air gap AG1 between the metal line 12 and the metal line 13 may be formed. The air gap AG1 may be located below the air gap AG2. The surface 121 of the metal line 12, the surface 131 of the metal line 13, and the surface 101 of the dielectric layer 10 may be exposed to air through the air gaps AG1 and AG2. For example, the surface 101 of the dielectric layer 10 may have a portion 101*a* and a portion 101*b* connected with the portion 101*a*. The portion 101*a* may be exposed from the metal line 12. The portion 101*a* may be exposed to the air gap AG1. The portion 101*b* may be covered by the metal line 12.

Figure 3J:
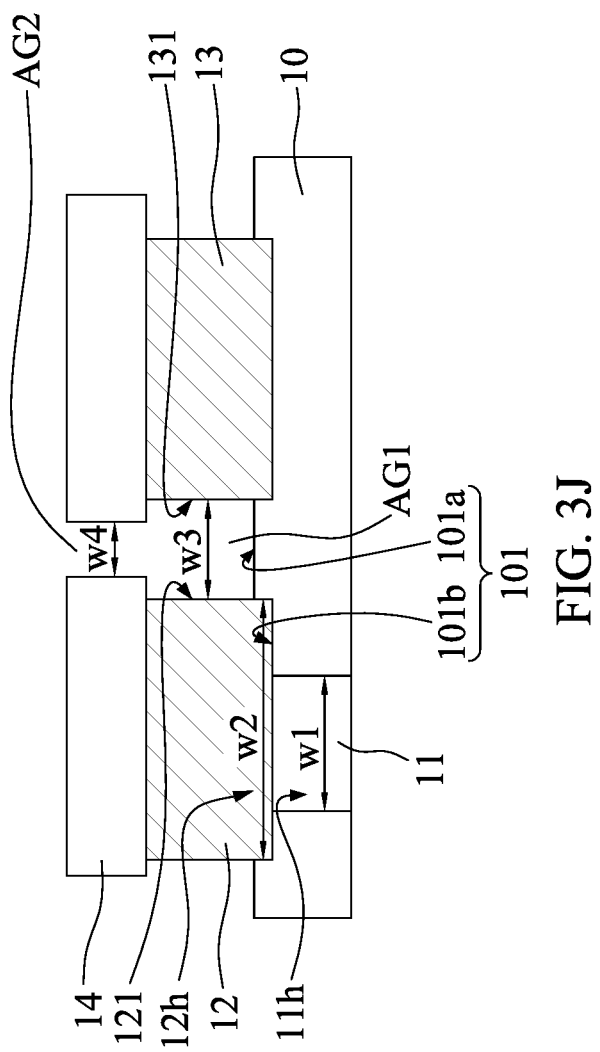
FIG. 3J illustrates one or more stages of a method of manufacturing an interconnection structure in accordance with some embodiments of the present disclosure.

Referring to FIG. 3J, the remaining photoresist layer 33 as shown in FIG. 3I may be removed by using suitable photoresist stripping techniques such as chemical solvent cleaning, plasma ashing, dry stripping, etc.

Figure 3K:
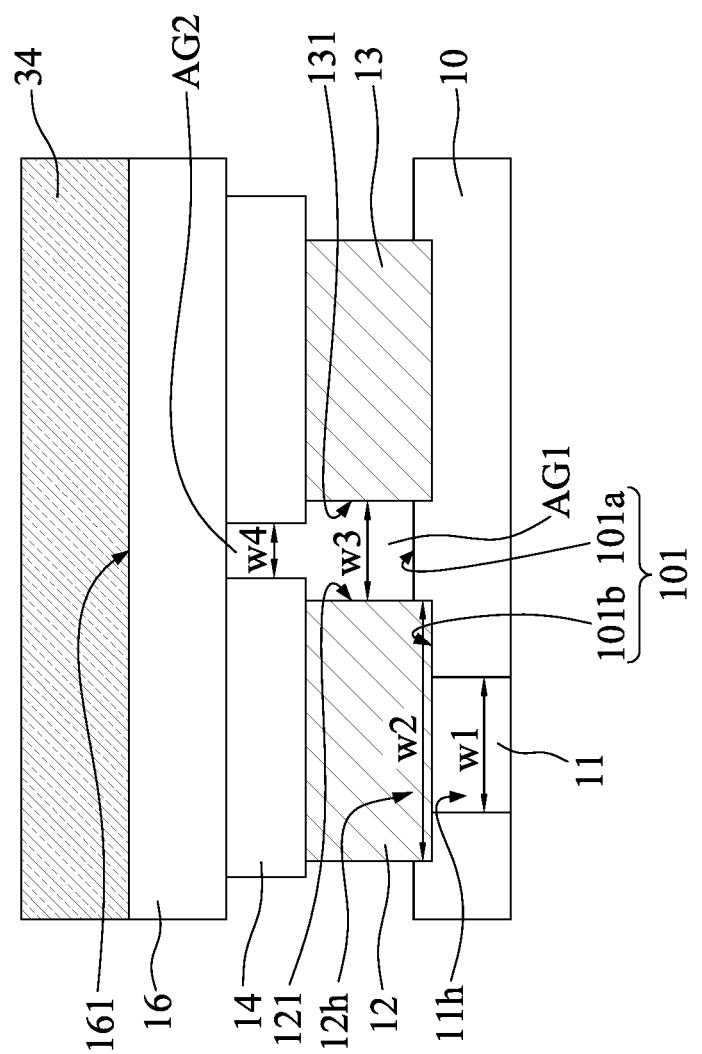
FIG. 3K illustrates one or more stages of a method of manufacturing an interconnection structure in accordance with some embodiments of the present disclosure.

Referring to FIG. 3K, the dielectric layer 16 may be disposed on the dielectric layer 14 to cover the air gap AG2. The dielectric layer 16 may be used to prevent conductive materials (such as conductive materials of the metal lines 17 and 18 in the operation shown in FIG. 3M) from filling into the air gap AG1 and the air gap AG2. Similar to the operation in FIG. 3A, a sacrificial layer 34 may be disposed on the dielectric layer 16. The sacrificial layer 34 may have or exhibit an etching property different from the dielectric layer 16. For example, the etch rate of the sacrificial layer 34 may be greater than the etch rate of the dielectric layer 16 in the selective etching operation in FIG. 3P.

Figure 3L:
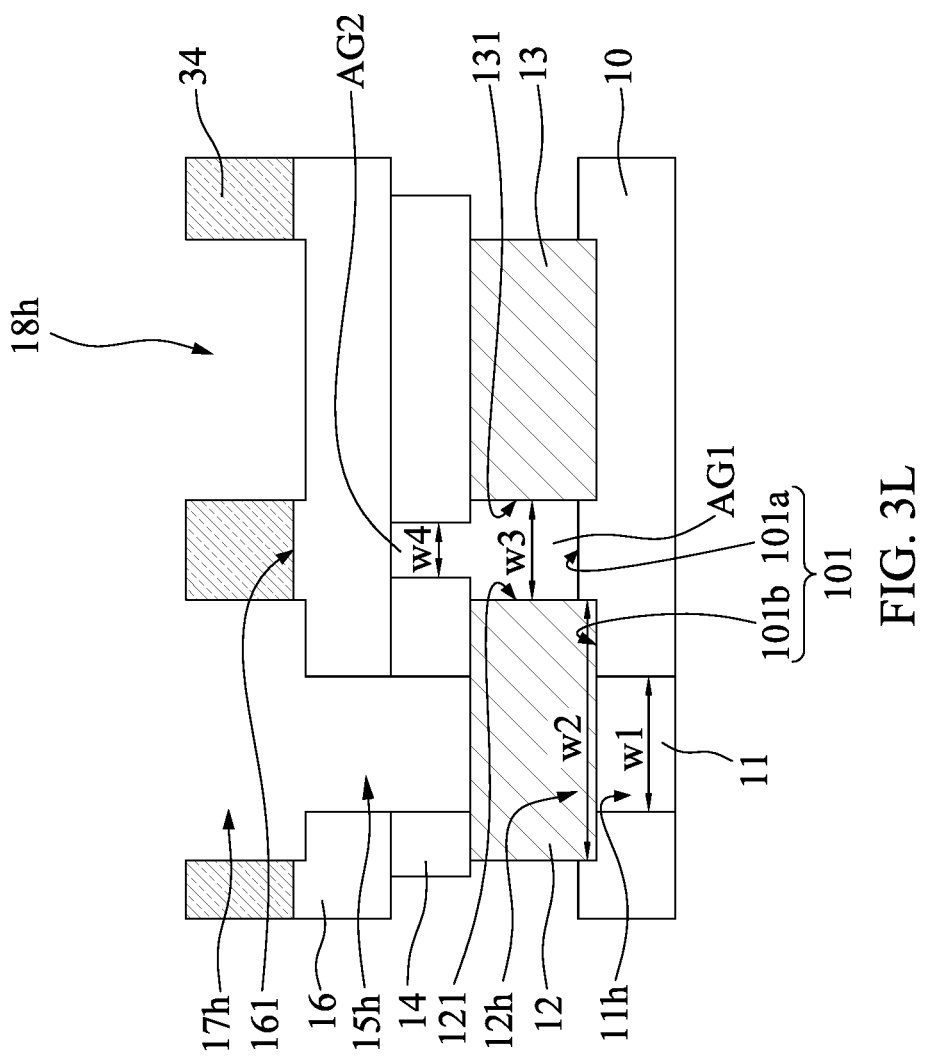
FIG. 3L illustrates one or more stages of a method of manufacturing an interconnection structure in accordance with some embodiments of the present disclosure.

Referring to FIG. 3L, operations similar to the operations in FIGS. 3B, 3C, 3D, and 3E may be repeated. Specifically, a via hole 15h may be formed in the sacrificial layer 34 and the dielectric layer 16. Trenches 17h and 18h may then be formed by etching away a part of the sacrificial layer 34 and a part of the dielectric layer 16. The via hole 15h may be exposed from the trench 17h.

Figure 3M:
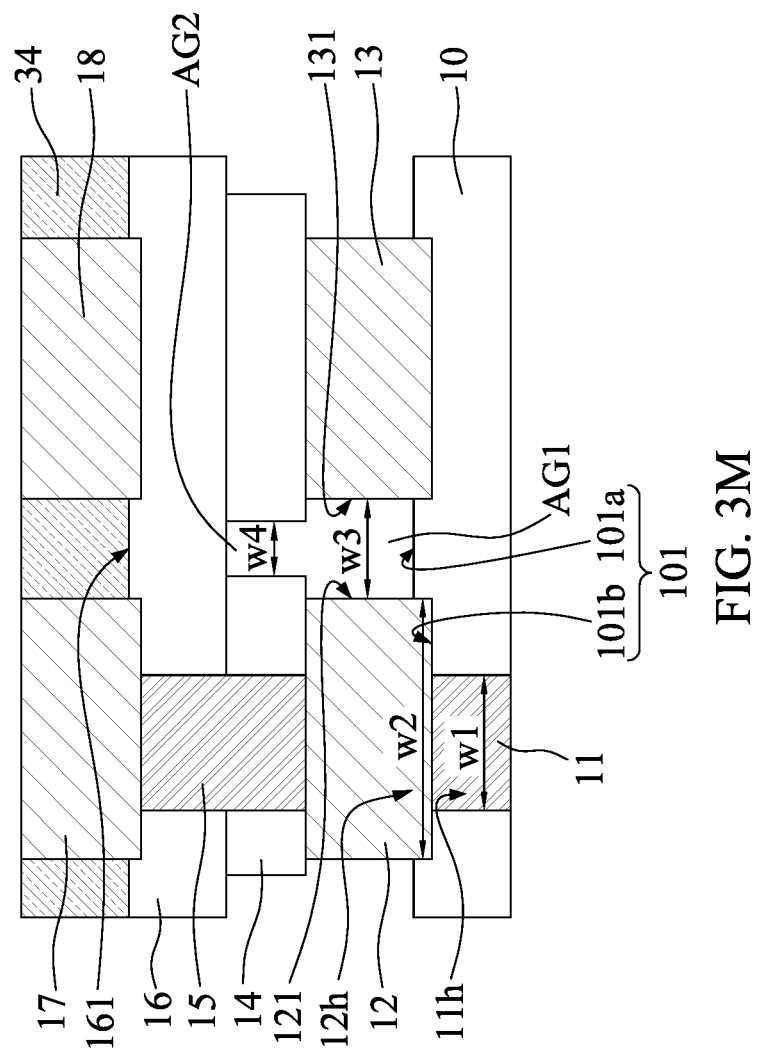
FIG. 3M illustrates one or more stages of a method of manufacturing an interconnection structure in accordance with some embodiments of the present disclosure.

Referring to FIG. 3M, similar to the operation in FIG. 3F, a conductive material of the conductive via 15 may be formed in the via hole 15h shown in FIG. 3E, and a conductive material of the metal lines 17 and 18 may be formed in the trenches 17h and 18h shown in FIG. 3E. The conductive material may be formed by suitable techniques such as electroplating, an electro-less plating process, CVD, PVD, etc. In some embodiments, the metal lines 17 and 18 and the conductive via 15 may be formed of the same material. In such embodiments, interface between the metal line 17 and the conductive via 15 may not be observed. In some embodiments, the conductive via 15, the metal line 17 and the metal line 18 may be formed by dual damascene techniques. In some embodiments, the conductive via 15, the metal line 17 and the metal line 18 may be formed in the same operation.

Figure 3N:
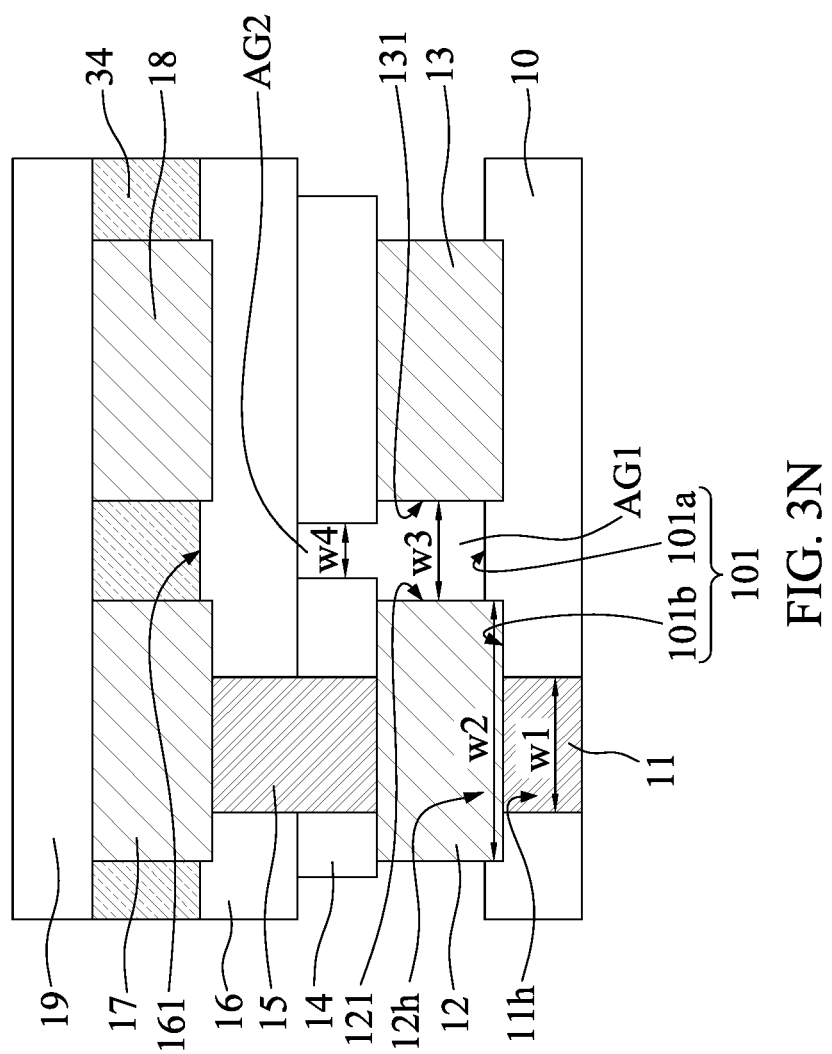
FIG. 3N illustrates one or more stages of a method of manufacturing an interconnection structure in accordance with some embodiments of the present disclosure.

Referring to FIG. 3N, similar to the operation in FIG. 3G, the dielectric layer 19 may be disposed on the sacrificial layer 34 and the metal lines 17 and 18. The dielectric layer 19 may have or exhibit an etching property different from the sacrificial layer 34.

Figure 3O:
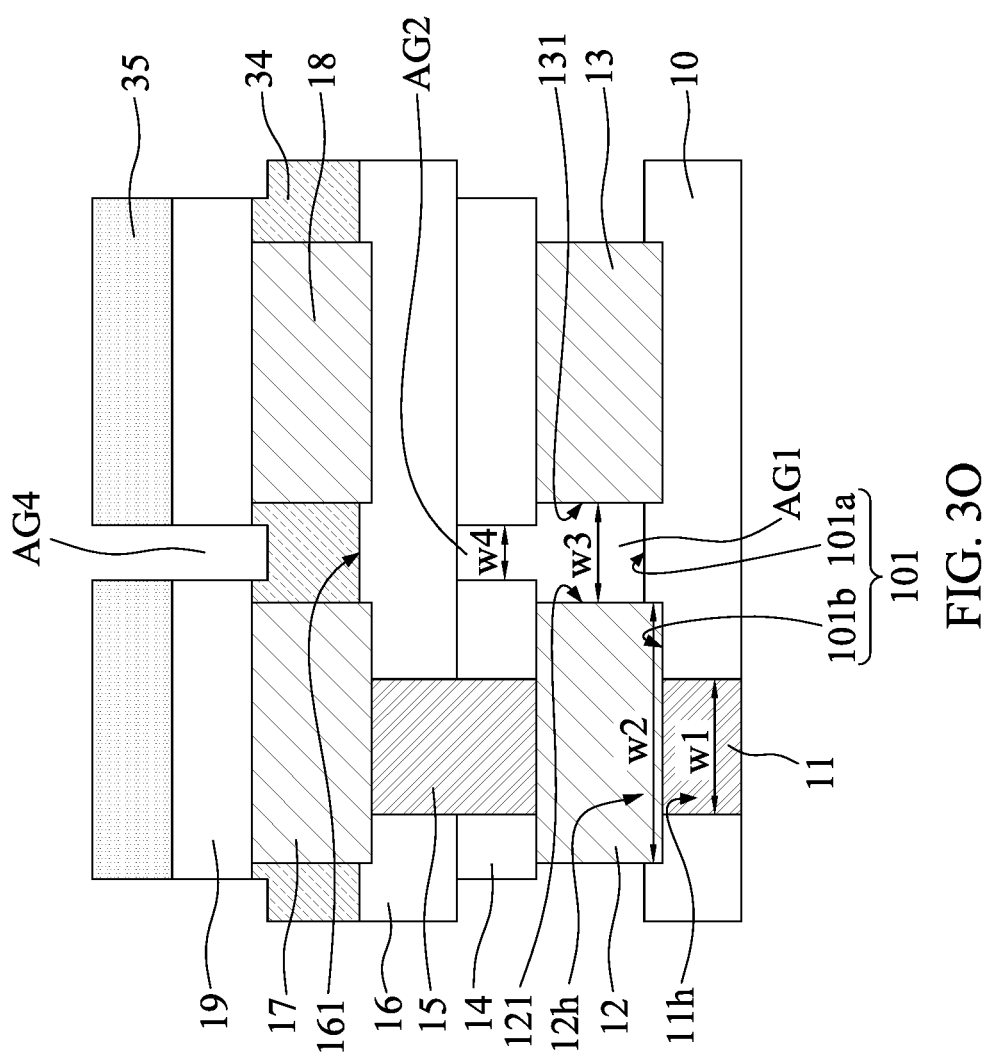
FIG. 3O illustrates one or more stages of a method of manufacturing an interconnection structure in accordance with some embodiments of the present disclosure.

Referring to FIG. 3O, similar to the operation in FIG. 3H, a photoresist layer 35 and a hard mask (not illustrated in the figures) may be formed over the dielectric layer 19. The photoresist layer 35 may be patterned, exposed, and developed as part of a suitable photolithography process. After the photolithography process finishes, an air gap AG4 may be formed in the dielectric layer 19 as shown in FIG. 3O. The air gap AG4 defined by the dielectric layer 19 may be spaced apart from the metal lines 17 and 18 to prevent the metal lines 17 and 18 from being undermined or damaged.

Figure 3P:
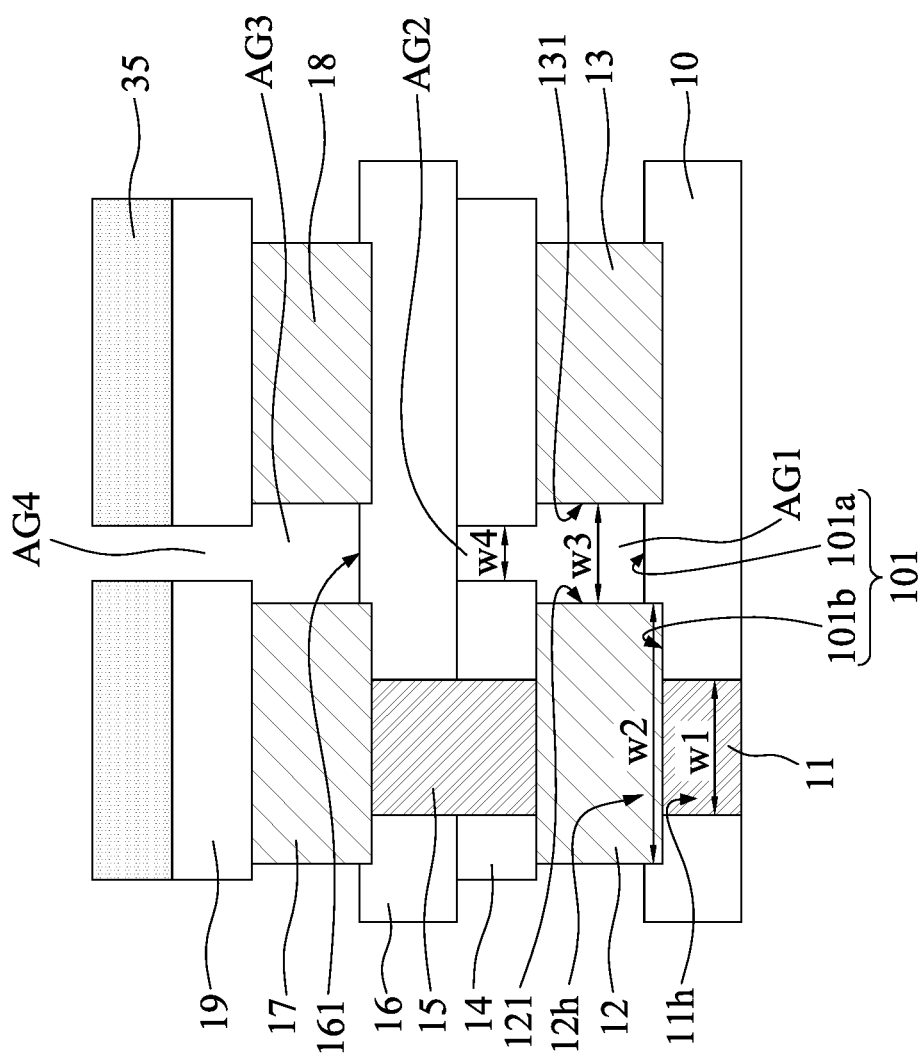
FIG. 3P illustrates one or more stages of a method of manufacturing an interconnection structure in accordance with some embodiments of the present disclosure.

Referring to FIG. 3P, a selective etching may be performed to remove the sacrificial layer 34. The etch rate of the sacrificial layer 34 may be greater than the etch rate of the dielectric layer 16 so the elements below the dielectric layer 16 can be protected from the erosion.

After removing the sacrificial layer 34, the air gap AG3 between the metal line 17 and the metal line 18 may be formed. The air gap AG3 may be located below the air gap AG4. A part of the metal line 17, a part of the metal line 18, and the surface 161 of the dielectric layer 16 may be exposed to air through the air gaps AG3 and AG4.

Referring to FIG. 3Q, the remaining photoresist layer 35 as shown in FIG. 3P may be removed by using suitable photoresist stripping techniques such as chemical solvent cleaning, plasma ashing, dry stripping, etc.

Figure 4:
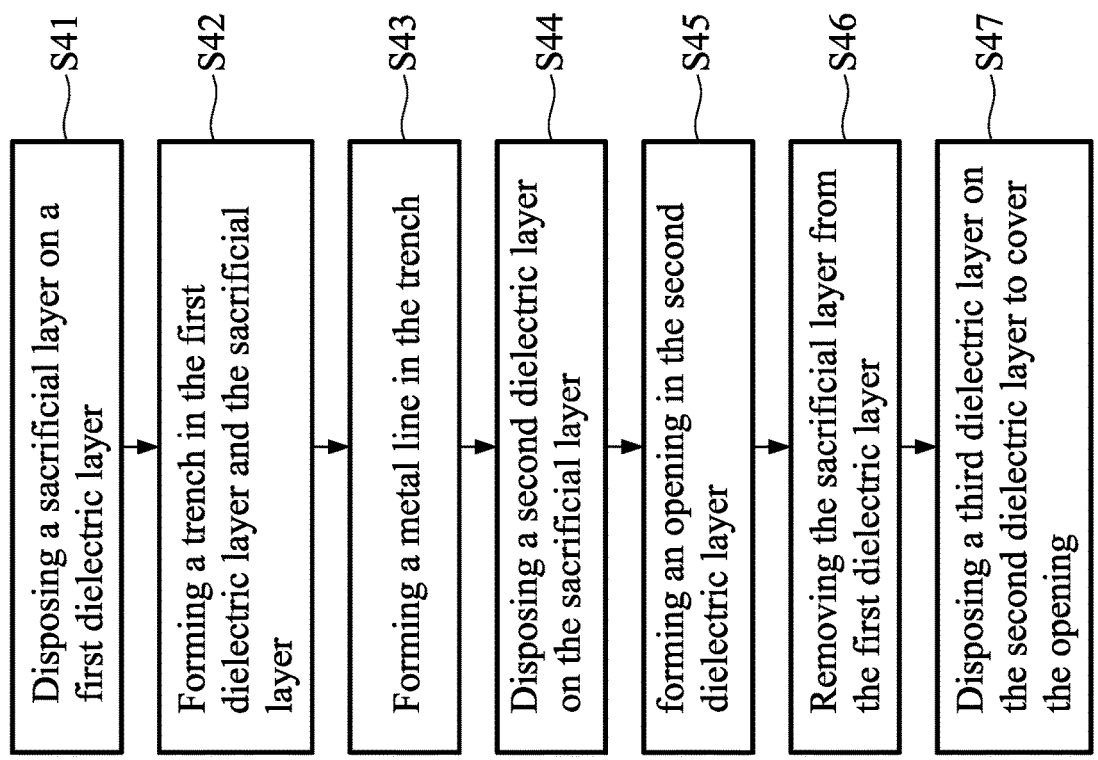
FIG. 4 illustrates a flow chart of a method of manufacturing an interconnection structure in accordance with some embodiments of the present disclosure.

FIG. 4 illustrates a flow chart of a method 40 of manufacturing an interconnection structure in accordance with some embodiments of the present disclosure.

In some embodiments, the method 40 may include step S41, disposing a sacrificial layer on a first dielectric layer. For example, the sacrificial layer 30 may be disposed on the dielectric layer 10 as shown in FIG. 3A.

In some embodiments, the method 40 may include step S42, forming a trench in the first dielectric layer and the sacrificial layer. For example, the trench 12h with the dimension w2 and the trench 13h may be formed in the sacrificial layer 30 and the dielectric layer 10 as shown in FIG. 3D.

In some embodiments, the method 40 may include step S43, forming a metal line in the trench. For example, the metal lines 12 and 13 may be formed in the trenches 12h and 13h as shown in FIG. 3F.

In some embodiments, the method 40 may include step S44, disposing a second dielectric layer on the sacrificial layer. For example, the dielectric layer 14 may be disposed on the sacrificial layer 30 as shown in FIG. 3G.

In some embodiments, the method 40 may include step S45, forming an opening in the second dielectric layer. For example, the air gap AG2 with the dimension w4 may be formed in the dielectric layer 14 as shown in FIG. 3H.

In some embodiments, the method 40 may include step S46, removing the sacrificial layer from the first dielectric layer. For example, after removing the sacrificial layer 30, the air gap AG1 between the metal line 12 and the metal line 13 may be formed as shown in FIG. 3I.

In some embodiments, the method 40 may include step S47, disposing a third dielectric layer on the second dielectric layer to cover the opening. For example, the dielectric layer 16 may be disposed on the dielectric layer 14 to cover the air gap AG2 as shown in FIG. 3K.

At least some of these steps have been simplified for a better understanding of the aspects of the present disclosure. In some embodiments, the interconnection structure 1 in FIG. 1 may be manufactured by the steps described with respect to FIG. 4.

One aspect of the present disclosure provides an interconnection structure. The interconnection structure includes a first dielectric layer, a first conductive via in the first dielectric layer, and a first metal line disposed on the first dielectric layer and electrically connected with the first conductive via. At least a portion of the first metal line is exposed to a first air gap.

Another aspect of the present disclosure provides an interconnection structure. The interconnection structure includes a first dielectric layer and a second dielectric layer disposed over the first dielectric layer. The interconnection structure also includes a first conductive structure disposed between the first dielectric layer and the second dielectric layer and a second conductive structure disposed between the first dielectric layer and the second dielectric layer. The second conductive structure is isolated from the first conductive structure through a first air gap.

Another aspect of the present disclosure provides a method of manufacturing an interconnection structure. The method includes disposing a sacrificial layer on a first dielectric layer. The sacrificial layer has an etching property different from the first dielectric layer. The method also includes forming a trench in the first dielectric layer and the sacrificial layer. The method also includes forming a first metal line in the trench and removing the sacrificial layer from the first dielectric layer.

The air in the air gap exhibits a permittivity approximately equal to 1. Such a low permittivity helps to reduce the capacitive coupling between adjacent metal lines. Therefore, the overall performance characteristics of a semiconductor device including the interconnection structure 1 may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing an interconnection structure, comprising:
    disposing a sacrificial layer on a top surface of a first dielectric layer, wherein the sacrificial layer has an etching property different from the first dielectric layer;
    forming a via hole through the first dielectric layer and the sacrificial layer;
    forming a trench in the first dielectric layer and the sacrificial layer coaxially along the via hole by widening the via hole through the first dielectric layer and extending into the top surface to remove a portion of the first dielectric layer, wherein a width of the trench is larger than a width of the via hole; and
    forming a second metal line on the first dielectric layer, wherein a portion of | the top surface of the first dielectric layer between the first metal line and the second metal line is exposed to air to form a first air gap after the sacrificial layer is removed;
    wherein, before removing the sacrificial layer from the first dielectric layer, the method further comprises disposing a second dielectric layer on the sacrificial layer to cover a top surface of the sacrificial layer, a top surface of the first metal line and a top surface of the second metal line, wherein the top surface of the sacrificial layer, the top surface of the first metal line and the top surface of the second metal line are coplanar with each other, wherein the second dielectric layer has an etching property different from the sacrificial layer.

2. The method of claim 1, further comprising:
    forming an opening through the second dielectric layer at a position between the first metal line and the second metal line to form a second air gap; and
    removing a portion of the sacrificial layer through the opening to form the first air gap communicating with the second air gap.

3. The method of claim 2, further comprising:
    disposing a third dielectric layer on the second dielectric layer to cover the opening and to cover the first air gap and the second air gap.

4. The method of claim 3, wherein the third dielectric layer is disposed on the second dielectric layer after the sacrificial layer is removed, such that the first air gap and the second air gap are formed between the first dielectric layer and the third dielectric layer.

5. The method of claim 2, wherein a width of the first air gap is larger than a width of the second air gap.

* * * * *